United States Patent
Inoue et al.

(10) Patent No.: US 8,409,498 B2
(45) Date of Patent: Apr. 2, 2013

(54) METHOD OF PRODUCING A SPUTTER TARGET MATERIAL

(75) Inventors: Keisuke Inoue, Yasugi (JP); Tsuyoshi Fukui, Nanbu (JP); Shigeru Taniguchi, Taipei (TW); Norio Uemura, Yonago (JP); Katsunori Iwasaki, Yasugi (JP); Kazuya Saitoh, Yasugi (JP)

(73) Assignee: Hitachi Metals, Ltd., Tokyo (JP)

( * ) Notice: Subject to any disclaimer, the term of this patent is extended or adjusted under 35 U.S.C. 154(b) by 890 days.

(21) Appl. No.: 12/479,121

(22) Filed: Jun. 5, 2009

(65) Prior Publication Data

US 2009/0238712 A1    Sep. 24, 2009

Related U.S. Application Data

(62) Division of application No. 11/070,339, filed on Mar. 3, 2005, now abandoned.

(30) Foreign Application Priority Data

Mar. 31, 2004  (JP) ................. 2004-102899
Apr. 16, 2004  (JP) ................. 2004-121955

(51) Int. Cl.
*B22F 1/00* (2006.01)

(52) U.S. Cl. ............... 419/32; 204/298.13; 204/298.12; 419/19; 419/28; 419/30; 419/33; 419/48

(58) Field of Classification Search ..................... 419/32
See application file for complete search history.

(56) References Cited

U.S. PATENT DOCUMENTS

2004/0262157 A1    12/2004    Ford et al.

FOREIGN PATENT DOCUMENTS

| CN | 1476420 | 2/2004 |
|---|---|---|
| JP | 09-059768 | 3/1997 |
| JP | 2000-045066 | 2/2000 |
| JP | 2002-327264 | 11/2002 |
| WO | 95/16797 | 6/1995 |
| WO | 03/010112 | 2/2003 |

OTHER PUBLICATIONS

Machine translation of JP 2002-327264 (Japanese document published Nov. 15, 2002).*

* cited by examiner

*Primary Examiner* — Roy King
*Assistant Examiner* — Christopher Kessler
(74) *Attorney, Agent, or Firm* — Sughrue Mion, PLLC

(57) ABSTRACT

A sputter target material which is of a sintered material, wherein the sputter target material consists of 0.5 to 50 atomic % in total of at least one metal element (M) selected from the group of Ti, Zr, V, Nb and Cr, and the balance of Mo and unavoidable impurities, and has a microstructure seen at a perpendicular cross section to a sputtering surface, in which microstructure oxide particles exist near a boundary of each island of the metal element (M), and wherein the maximum area of the island, which is defined by connecting the oxide particles with linear lines so as to form a closed zone, is not more than 1.0 mm$^2$.

6 Claims, 3 Drawing Sheets

50μm

METHOD OF PRODUCING A SPUTTER TARGET MATERIAL

CROSS REFERENCE TO PRIOR APPLICATIONS

This application is a division of U.S. application Ser. No. 11/070,339, filed on Mar. 3, 2005, now abandoned, and claims priority to Japanese Patent Applications No. 2004-102899 filed on Mar. 31, 2004, and 2004-121955 filed on Apr. 16, 2004.

BACKGROUND OF THE INVENTION

The present invention relates to a sputter target material, more particularly to a sputter target material used for forming Mo alloy thin films which are used as electrical wiring, electrodes and so on in flat panel display devices, and a method of producing the same.

DESCRIPTION OF THE RELATED ART

Presently, films of a refractory metal, e.g. Mo, which have low electrical resistance, are broadly used for thin film electrodes and thin film wiring in liquid crystal displays (herein referred to as LCDs) which are one type of flat panel display devices. Since these thin-film electrodes, thin-film wiring, etc. are required to have heat-resistance and corrosive resistance properties during producing the thin film, there is a tendency to favorably use Mo alloys containing additive Cr or W, for example.

In general, when the Mo alloys are used to form wiring, the sputtering method is carried out with utilization of a target material having the same chemical composition as the wiring material. With regard to the sputter-target material of the Mo alloy, there have been various proposals including preferred chemical compositions and methods how to reduce impurities in the target material.

For example, JP-A-09-059768 teaches a Mo—Cr alloy, which contains 1 to 5 wt % Cr, as a sputter target material.

WO 95-16797 teaches a Mo—W alloy, which contains 20 to 70 atomic % W, as a sputter target material.

JP-A-2002-327264 teaches a Mo alloy, which contains 2 to 50 atomic % of Nb and/or V, as a sputter target material.

With regard to Mo having a high melting point, since it is difficult to produce a sputter target material therefrom by the melting/casting process, the powder sintering method is generally used for producing such material.

A sputter target material of a Mo alloy is produced by sintering a blend powder consisting of a Mo powder and a powder of an additive element(s). According to this method, particles of the additive element(s) in the blend powder are liable to agglomerate with one another. Thus, there arises a problem that a segregation of alloy components occurs after sintering resulting in that a thin film formed from the sintered material by sputtering has not a uniform distribution of component elements. Another problem is that when the sintered material is subjected to plastic working, defects such as cracking are liable to occur due to the segregation of component elements.

Taking account of the above problems in the prior art, an object of the present invention is to provide a Mo alloy sputter target material according to which a component segregation is restrained thereby improving the component uniformity of thin films formed from the Mo alloy sputter target material by sputtering.

BRIEF SUMMARY OF THE INVENTION

The present inventors carried out various researches on the above problems, and found a solution of the process that a powder blend consisting of powders of Mo and an additive metal element(s) M is prepared, the powder blend is compressed to produce a green compact, and the green compact of the powder is sintered to obtain a sintered product whereby making the additive metal element M, which is capable of fixing oxygen in the Mo matrix, to be quite finely dispersed in the Mo matrix, the sintered product having a metal structure in which oxygen in the Mo matrix is fixed around the element M. It was found also that the sintered product is improved in plastic workability by such oxygen fixing around the metal element M.

According to a first aspect of the present invention, there is provided a sputter target material which is of a sintered material, wherein the sputter target material consists of 0.5 to 50 atomic % in total of at least one metal element (M) selected from the group of Ti, Zr, V, Nb and Cr, and the balance of Mo and unavoidable impurities, and has a microstructure seen at a perpendicular cross section to a sputtering surface, in which microstructure oxide particles exist near a boundary of each island of the metal element (M), and wherein the maximum area of the island, which is defined by connecting the oxide particles with linear lines so as to form a closed zone, is not more than $1.0\ mm^2$. Preferably, the metal element (M) is Nb. The area of the sputtering surface of the sputter target material is preferably not less than $1\ m^2$.

One embodiment of the sputter target material has a rectangular sputtering surface each side length of which is preferably not less than 1 m.

According to a second aspect of the present invention, there is provided a method of producing a sputter target material, which comprises the steps of:

blending raw powders of Mo and at least one metal element (M) selected from the group consisting of Ti, Zr, V, Nb and Cr;

compressing the blended raw powders to form a green compact;

pulverizing the green compact to produce a secondary powder having an average particle size of not more than 5.0 mm;

filling the secondary powder into a pressurizing container; and sintering the secondary powder as contained in the pressurizing container under pressure, whereby obtaining the sputter target material, wherein the sputter target has a microstructure seen at a perpendicular cross section to a sputtering surface, in which microstructure oxide particles exist near a boundary of each island of the metal element (M), and wherein the maximum area of the island, which is defined by connecting the oxide particles with linear lines so as to form a closed zone, is not more than $1.0\ mm^2$.

Preferably, the sintered material is subjected to plastic working.

According to the invention Mo alloy sputter target material, a component segregation in the Mo alloy sputter target material is restrained, it is possible to improve the component uniformity of thin films formed from the Mo alloy sputter target material by sputtering, and the Mo alloy sputter target material has improved plastic workability.

DETAILED DESCRIPTION OF THE INVENTION

A key aspect of the invention resides in finding the microstructure of the Mo alloy sputter target material which consists of 0.5 to 50 atomic % in total of at least one metal element (M) selected from the group of Ti, Zr, V, Nb and Cr, and the balance of Mo and unavoidable impurities, and which has a restrained component segregation, wherein the sputter target material has a microstructure seen at a perpendicular cross section to a sputtering surface, in which microstructure oxide particles exist near a boundary of each island of the metal element (M), and wherein the maximum area of the island, which is defined by connecting the oxide particles with linear lines so as to form a closed zone, is not more than 1.0 mm². According to such a microstructure, the Mo alloy sputter target material has improved plastic workability.

Herein below there will be described details of the metal structure and reasons why the defined feature of the invention is preferred.

Figure 1:
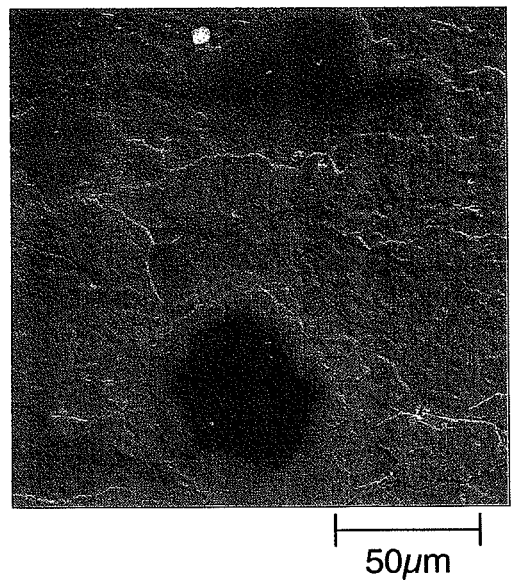
FIG. 1 is a photograph taken by a scanning electron microscope (SEM), which shows a sectional view of the microstructure of an Mo—Cr alloy as an invention sputter target material.
Figure 2:
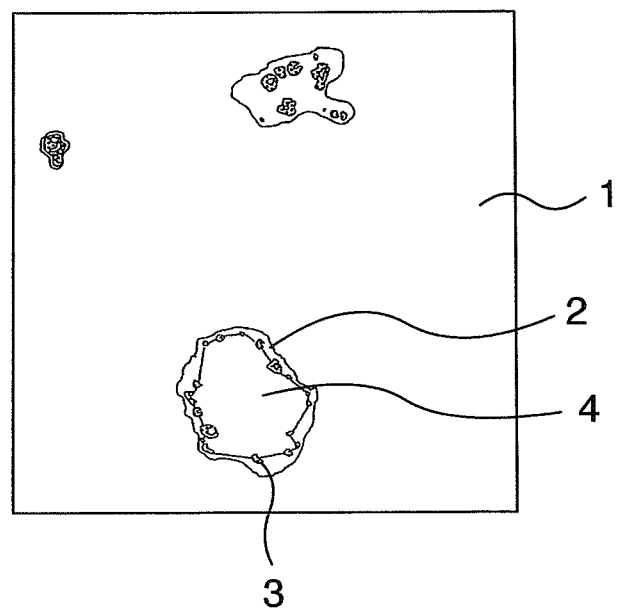
FIG. 2 is a schematic illustration of the microstructure shown in FIG. 1.

The invention sputter target material has a microstructure, in which islands of the metal element M (e.g. Cr) are dispersed in the Mo matrix, as can be seen in the microscopic photograph of a sectional view of a Mo—Cr alloy shown in FIG. 1. Referring to FIG. 2 showing schematically the microstructure of FIG. 1, details thereof will be described. In the invention sputter target material, there are formed oxide particles 3 within and around each island 2 of the metal element M in the Mo matrix 1. The island area of the metal element M defined by connecting the oxide particles 3, existing near a boundary of each island 2 of the metal element M with linear lines so as to form a closed zone, as shown in FIG. 2, means an area 4 surrounded by line segments connecting the centers of the oxides 3 existing around each island of the metal element M.

The at least one metal element M selected from the group consisting of Ti, Zr, V, Nb and Cr is of a preferable additive to the Mo alloy because the corrosion resistance property of Mo can be improved by the additive. The respective metal element M is liable to form an oxide(s) because of a lower energy level of oxide formation than Mo. Therefore, when producing a Mo alloy target material from a Mo powder and a powder of the metal element M by the powder metallurgical method, oxygen (as a solute or a precipitate including oxides) existing in the Mo matrix is fixed around each island of the metal element(s) M as an oxide(s). It is believed that the plastic workability of the Mo matrix itself is improved by such a movement of oxygen from the Mo matrix, and that the plastic workability of an entire sintered material is also improved because of fine dispersion of islands of the metal(s) M of which oxide(s) is fixed within or around the metal element(s) M.

In the invention, it is desirable from the viewpoint of restraining the segregation of components and the good plastic workability to make the area of each island of the metal element(s) M smaller, which area is defined by connecting oxide particles existing near a boundary of each of the islands of the metal element(s) M, observed in the sectional microstructure of the target material with linear lines to form a closed zone. The present inventors considered the optimal area size of the islands of the metal element(s) M from the viewpoint of plastic workability of the sputter target material and characteristics of thin films formed from the sputter target material by sputtering, and concluded that the area should be even at the largest not more than 1.0 mm², preferably not more than 0.1 mm².

The reason why the content of the metal element(s) M is set to be 0.5 to 50 atomic % is that, if the lower limit were less than 0.5 atomic %, the effect of the metal element(s) M, which is of oxygen absorption from Mo, becomes extremely small, and in the case of the element(s) M content exceeding 50 atomic %, the inherent characteristics of Mo is deprived.

Now, there will be described below a preferable method of producing the invention sputter target material.

As stated above, the invention sputter target material is characterized in that the element(s) M absorbs oxygen adhered on particles of the Mo raw powder. Since the raw powder of the metal element(s) M differ from Mo in powder characteristics including specific gravity, shape and particle size, it is impossible to realize a uniform dispersion of the powder blend by merely blending the both powders. This means that a degree of dispersion uniformity of the powder blend is important in the view point of making the most of characteristics of the Mo alloy containing an additive metal element(s) M.

With regard to blending the raw powders of Mo and the metal element(s) M, in order to realize a uniform dispersion the metal element(s) M, it is very important to rely on the process which comprises blending raw powders of Mo and the metal element(s) M by means of a usual blender such as a V-type blender or a cross rotary mixer, compressing the powder blend, for example, by the cold isostatic pressing method (CIP) to form a green compact, and pulverizing the green compact to produce a secondary powder. This is because, while the green compact produced by compressing (e.g. the CIP method) has a component uniformity reflecting the state of the raw powder blend, when pulverizing the green compact, the compressed powder is separated and finely dispersed thereby improving the component uniformity of the secondary powder. The particle size of the secondary powder is also important in the view point of a dispersion effect. If an average particle size of the secondary powder exceeds 5 mm, the dispersion effect by re-pulverizing is small. Therefore, the average particle size of the secondary powder is preferably not more than 5 mm, more preferably not more than 3 mm, and desirably not more than 1 mm.

The secondary powder is subjected to the following process to obtain a target material having a desired size:

(1) the secondary powder is filled in a pressurizing container;

(2) the pressurizing container is sealed after deaerating the secondary powder therein;

(3) the filled powder is subjected to sintering under pressure as contained in the container to obtain a sintered body; and (4) the sintered body is subjected to machining or plastic working (e.g. hot rolling) to obtain the target material.

By the sintering method with use of the secondary powder, it is possible to realize a uniform dispersion of components in the secondary powder prior to sintering under pressure thereby enabling the target material to have the metal element(s) M finely dispersed in the Mo matrix, whereby enabling the area of each island of the metal element(s) M in the Mo matrix to be not more than 1.0 mm².

The metal elements M to be contained in the invention sputter target material are preferably V, Nb and Cr, because, when the sputter target material is used for forming of thin-film wiring and thin-film electrodes in LCDs and so on, the thin-film can have a low electric resistance and corrosion resistance property. Among them, Nb is particularly preferable because of its low electrical resistance. While additive Zr and Ti increase the electric resistance of Mo as compared with V, Nb and Cr, since they are considerably effective in improving the corrosion resistance property, they are preferably used in forming a barrier film for a primary conductive film in LCDs and so on.

Recently, in response to the trend toward larger size panels of LCDs, the sputter target material used in the thin-film wiring and the thin-film electrodes in LCDs is also required to have a large sputtering surface area of not less than 1 m² or each side length of not less than 1 m.

In order to produce such a large area or a long size target material, there is one idea of subjecting the sintered product to plastic working. In view of this, since a sputter target material having the invention metal structure has excellent plastic workability and an excellent component uniformity at the sputtering surface, it is highly suitable for producing those having not less than 1 m² of a sputtering surface or each side length of not less than 1 m.

Also, preferably a sputter target material having the invention metal structure has characteristics that, when an entire length of the sputter target material is defined by the maximum length of a longest linear line which can be drawn across the sputtering surface, and when the sputter target material is examined at each 50 mm length portion along the entire length, a relative density is not less than 98% in every portion, and a variation of content rates of the metal element(s) M is not more than 20%. The variation of content rates of the metal element(s) M means a difference between the maximum and the minimum content rates of the metal element(s) M with regard to a nominal chemical composition of the invention sputter target material. Specifically, the variation can be evaluated by a value which is obtained by dividing the maximum difference of the content rates of the metal element(s) M, examined at each 50 mm length portion as mentioned above, by a nominal content rate of the metal element(s) M in the invention sputter target material. The reason why the variation of content rates of the metal element(s) M is preferably set to be not more than 20% is that the smaller the variation, the more uniformly the metal element(s) M is dispersed whereby expectable to form a deposition film with uniform film characteristics when sputtering. If the variation exceeds 20%, the component variation of the metal element(s) M among the examined 50 mm length portions as mentioned above is larger, whereby occurring local differences in concentration of the metal element(s) M in a deposition film formed by sputtering resulting in a difference in film characteristics thereby adversely affecting etching property of the film.

Example 1

There were prepared a Mo powder having an average particle size of 6 µm, a Nb powder having an average particle size of 100 µm, a Cr powder having an average particle size of 100 µm, a Ti powder having an average particle size of 100 µm, a Zr powder having an average particle size of 100 µm, and a V (vanadium) powder having an average particle size of 100 µm.

Invention Specimen Nos. 1 to 6 target materials shown in Table 1 were produced by the following process.

(1) In order to produce each of the specimens, given amounts in atomic % of the Mo powder and any one of the additive element powder were checkweighed.

(2) The checkweighed powders were blended for 10 minutes with utilization of a V-type blender to obtain a raw material powder.

(3) The raw material powder was compressed by a CIP machine to form a green compact.

(4) The green compact was pulverized with utilization of a jaw crusher and a disc mill to produce a secondary powder.

(5) The secondary powder was blended in a V-type blender for 10 minutes and subsequently filled into a pressurizing container which is made of low carbon steel and has an inner space dimension of a thickness of 100 mm, a width of 1250 mm and a height of 1450 mm. After filling the secondary powder into the pressurizing container, a top lid with a deaerating port was welded to the pressurizing container in order to close an inlet opening thereof.

(6) The pressurizing container filled with the secondary powder was subjected to a deaerating process under vacuum at a temperature of 450° C. and subsequently the deaerating port was sealed.

(7) The secondary powder was sintered under pressure together with the pressurizing container by means of a HIP machine. Operational conditions of the HIP machine were of a temperature of 1250° C., a pressure of 120 MPa and an operation time of 5 hours.

(8) The thus obtained sintered body was sliced and machined to produce a sputter target material having a rectangular shape of which dimension is of a thickness of 16 mm, a width of 980 mm and a length of 1150 mm.

Comparative Specimen Nos. 7 and 8 target materials shown in Table 1 were produced by the following process.

(1) In order to produce each of the specimens, given amounts in atomic % of the Mo powder and the Nb powder were checkweighed.

(2) The checkweighed powders were blended for 10 minutes with utilization of a V-type blender to obtain a raw material powder.

(3) The raw material powder was filled, without compression working, into a pressurizing container which is made of low carbon steel and has the same inner space dimension as mentioned above. After filling the raw material powder into the pressurizing container, a top lid with a deaerating port was welded to the pressurizing container in order to close an inlet opening thereof.

(4) The pressurizing container filled with the raw material powder was subjected to a deaerating process under vacuum at a temperature of 450° C. and subsequently the deaerating port was sealed.

(5) The filled powder was sintered under pressure together with the pressurizing container by means of a HIP machine. Operational conditions of the HIP machine were of a temperature of 1250° C., a pressure of 120 MPa and an operation time of 5 hours.

(6) The thus obtained sintered body was sliced and machined to produce a sputter target material having a rectangular shape of which dimension is of a thickness of 16 mm, a width of 890 mm and a length of 980 mm.

Figure 3:
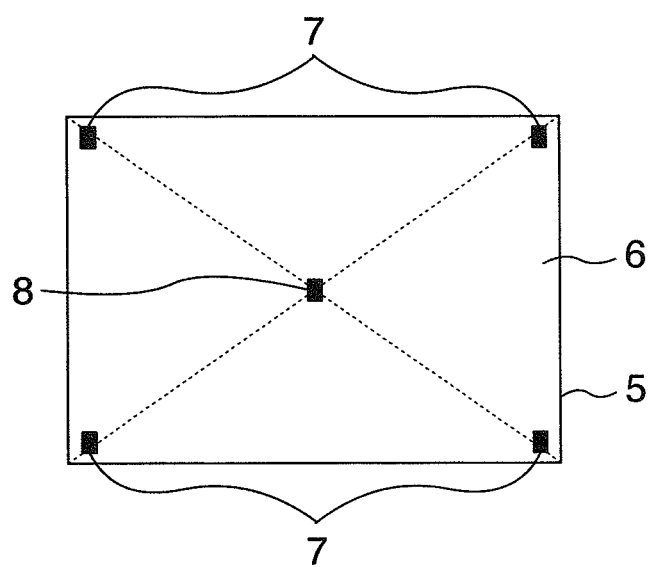
FIG. 3 is a schematic illustration showing the sampling positions of test pieces in the Example.

Test pieces were taken from each of the above specimens, each of which has a section perpendicular to the sputtering surface, the sectional surface having a size of 6×10 mm. The test pieces were taken from five positions at the ends 7 of diagonal lines and the center 8 of a sputter target material 5 as shown in FIG. 3 which is a view of a sputtering surface 6. A microstructure of the respective test piece was observed by means of a scanning electro microscope (SEM).

With regard to the observation of the microstructure by means of the SEM, observing the overall sputtering surface of the respective test piece and selecting an island of the metal element M having the maximum area which is defined by connecting the oxide particles, existing near a boundary of the island of the metal element M with linear lines so as to form a closed zone, the selected island is determined as the representative island of the metal element M of the pertinent test piece. A photograph was taken of the microstructure around the representative island of the metal element M in the respective test piece. With utilization of the photograph, the area of the representative island of the metal element M was determined by measuring the area of the above closed zone and also by the image analysis method with utilization of a binary image of the island. The maximum area value in the area values of the five test pieces taken from the respective specimen is shown in Table 1 as the representative value. Further, a relative density of the respective specimen was determined by the Archimedes method, which is shown in Table 1.

element M from one region to another of the material, and that the island area of the metal element M is more than 1.0 mm$^2$, respectively, which area is defined by connecting the oxide particles, existing near a boundary of the island of the metal element M with linear lines so as to form a closed zone.

Example 2

Sintered bodies, having the same chemical compositions and the same sizes as those produced in Example 1, respectively, were produced by the same manner as the case of Example 1, and subsequently subjected to hot rolling. The hot rolling after the HIP process was carried out for the respective sintered body, as contained in the pressurizing container without removing the container from the sintered body, such that a working process of heating up to a temperature of 1150° C. and rolling under a reduction ratio of not more than 50% was

TABLE 1

| Specimen No. | Chemical composition (atomic %) | Average particle size of raw material powder | | Average particle size of the secondary powder (*1) (mm) | Area of Island of metal element M (mm$^2$) | Relative density (%) | Remarks |
| --- | --- | --- | --- | --- | --- | --- | --- |
| | | Mo (μm) | Metal element M (μm) | | | | |
| 1 | 70Mo—30Ti | 6 | 100 | 1.0 | 0.007 | 98.9 | Invention Specimen |
| 2 | 91.5Mo—8.4Zr | 6 | 100 | 1.0 | 0.005 | 99.2 | Invention Specimen |
| 3 | 91.5Mo—8.4V | 6 | 100 | 1.0 | 0.003 | 99.3 | Invention specimen |
| 4 | 95Mo—5Nb | 6 | 100 | 1.0 | 0.002 | 99.6 | Invention specimen |
| 5 | 91.5Mo—1.5Nb | 6 | 100 | 1.0 | 0.009 | 99.6 | Invention specimen |
| 6 | 95.5Mo—4.5Cr | 6 | 100 | 1.0 | 0.005 | 99.4 | Invention specimen |
| 7 | 95Mo—5Nb | 6 | 100 | not prepared (*2) | 3.15 | 99.5 | Comparative specimen |
| 8 | 99.8Mo—0.2Nb | 6 | 100 | not prepared (*2) | 1.87 | 99.5 | Comparative specimen |

*Note 1: The secondary powder was produced by pulverizing a green compact of a raw material powder, which green compact was produced by the CIP method.
*Note 2: In specimen Nos. 7 and 8, no secondary powder was prepared.

Figure 4:
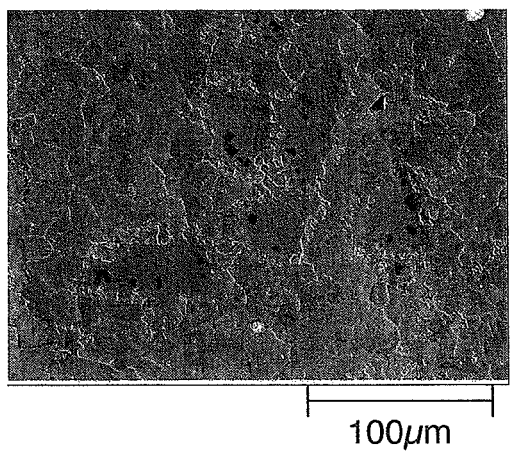
FIG. 4 is a photograph (magnification: 500 times) showing a microstructure of Invention Specimen No. 4 of the sputter target material, which was taken by an SEM.
Figure 5:
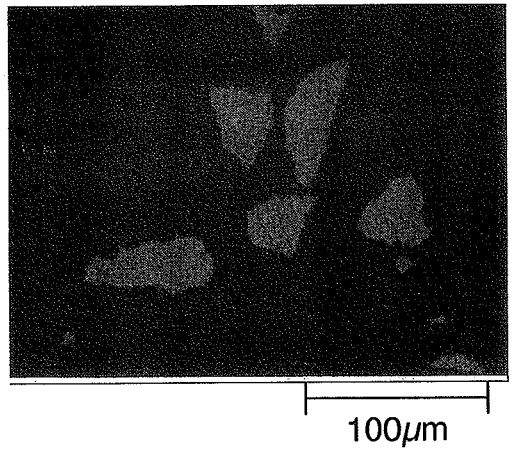
FIG. 5 is a sketch of the Nb islands color-mapped with an EPMA in the same field as FIG. 4.

FIG. 4 shows a photograph (magnification: 500 times) of the microstructure of Invention Specimen No. 4 sputter target material, which was taken by an SEM (Scanning Electron Microscope). FIG. 5 shows a sketch of Nb islands color-mapped with utilization of an Electron Probe Micro-Analyzer (EPMA) in the same field of view as FIG. 4. From FIGS. 4 and 5, it can be confirmed that five Nb islands exist in the center region of the drawings. Further, it can be seen from FIG. 4 that there exist oxide particles, distinguished by those black color, around the respective Nb island, and that the maximum area of any one of the Nb islands is not more than 1.0 mm$^2$, which maximum area is defined by connecting the oxide particles, existing around the island of the metal element M with linear lines so as to form a closed zone. It was also confirmed from the EPMA color map that the black particles-existing around the Nb islands in FIG. 4 were of oxides.

As shown in Table 1, it is appreciated that with regard to the sputter target materials of Invention Specimen Nos. 1 to 6, the island area of the metal element M is not more than 1.0 mm$^2$, respectively, which area is defined by connecting the oxide particles, existing near a boundary of the island of the metal element M with linear lines so as to form a closed zone.

On the other hand, with regard to the sputter target materials of Comparative Specimen Nos. 7 and 8, it was confirmed that there is a difference in the distribution of the metal repeated five times. An aimed rolling reduction ratio was 25%. After hot rolling, the respective work was sliced and machined to obtain a sputter target material having a rectangular form and a measurement of a thickness of 10 mm, a width of 1130 mm and a length of 1200 mm. As in the case of Example 1, five test pieces were taken from each of the specimen sputtering target materials, each of which has a section perpendicular to the sputtering surface, the sectional surface having a size of 6×10 mm. A microstructure of the respective test piece was observed by means of a scanning electro microscope (SEM). An area value of an island of the metal element M was measured with regard to the respective test piece, which area is defined by connecting the oxide particles, existing around the island of the metal element M with linear lines so as to form a closed zone. The measurement area values are shown in Table 2. Further, a relative density of the respective sputter target material was determined by the Archimedes method, which is also shown in Table 2. With regard to respective Comparative Specimen Nos. 17 and 18, no sputter target material can be produced, since cracks occurred on a peripheral surface of the sintered body during hot rolling.

TABLE 2

| Specimen No. | Chemical composition (atomic %) | Average particle size of raw material powder Mo (μm) | Average particle size of raw material powder Metal element M (μm) | Average particle size of the secondary powder (*1) (mm) | Area of Island of metal element M (mm$^2$) | Hot rolling | Relative density (%) | Remarks |
|---|---|---|---|---|---|---|---|---|
| 11 | 70Mo—30Ti | 6 | 100 | 1.0 | 0.006 | Yes | 99.1 | Invention Specimen |
| 12 | 91.5Mo—8.4Zr | 6 | 100 | 1.0 | 0.003 | Yes | 99.3 | Invention Specimen |
| 13 | 91.5Mo—8.4V | 6 | 100 | 1.0 | 0.005 | Yes | 99.5 | Invention specimen |
| 14 | 95Mo—5Nb | 6 | 100 | 1.0 | 0.002 | Yes | 99.7 | Invention specimen |
| 15 | 91.5Mo—1.5Nb | 6 | 100 | 1.0 | 0.004 | Yes | 99.7 | Invention specimen |
| 16 | 95.5Mo—4.5Cr | 6 | 100 | 1.0 | 0.006 | Yes | 99.6 | Invention specimen |
| 17 | 95Mo—5Nb | 6 | 100 | not prepared (*2) | — | No (cracks occurred) | — | Comparative specimen |
| 18 | 99.8Mo—0.2Nb | 6 | 100 | not prepared (*2) | — | No (cracks occurred) | — | Comparative specimen |

*Note 1: The secondary powder was produced by pulverizing a green compact of a raw-material powder, which green compact was produced by the CIP method.
*Note 2: In specimen Nos. 17 and 18, no secondary powder was prepared.

Figure 6:
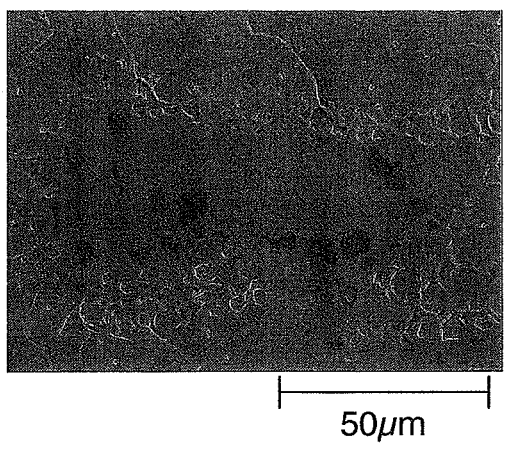
FIG. 6 is a photograph (magnification: 1500 times) showing a microstructure of Invention Specimen No. 14 of the sputter target material in Example 2, which was taken by an SEM.
Figure 7:
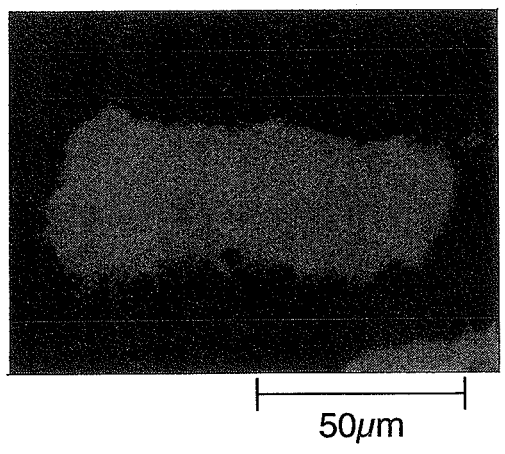
FIG. 7 is a sketch of the Nb island color-mapped with an EPMA in the same field as FIG. 6.

FIG. 6 shows a photograph (magnification: 1500 times) of the microstructure of Invention Specimen No. 14 sputter target material, which was taken by an SEM (Scanning Electron Microscope). FIG. 7 shows a sketch of Nb islands color-mapped with utilization of an Electron Probe Micro-Analyzer (EPMA) in the same field of view as FIG. 6. From FIGS. 6 and 7, it can be confirmed that a Nb island exist in the center region of the drawings. Further, it can be seen from FIG. 6 that there exist oxide particles, distinguished by those black color, around the Nb island, and that the maximum area of the Nb island is not more than 1.0 mm$^2$, which maximum area is defined by connecting the oxide particles, existing around the island of the metal element M with linear lines so as to form a closed zone. It was also confirmed from the EPMA color map that the black particles existing around the Nb island in FIG. 6 were of oxides.

As shown in Table 2, the respective Invention Specimen could be rolled to provide a given form, of which maximum area of the Nb island is not more than 1.0 mm$^2$, the maximum area being defined by connecting the oxide particles, existing near a boundary of the island of the metal element M with linear lines so as to form a closed zone. Further, Invention Specimen Nos. 11-16 have a satisfactory relative density, respectively.

The invention claimed is:

1. A method of producing a sputter target material, which comprises the steps of:
    blending raw powders of Mo and at least one metal element (M) selected from the group consisting of Ti, Zr, V, Nb and Cr;
    compressing the blended raw powders by a cold isostatic pressing method to form a green compact of the blended raw powder;
    pulverizing the green compact of blended raw powder to produce a secondary powder having an average particle size of not more than 5.0 mm;
    filling the secondary powder into a pressurizing container; and
    sintering the secondary powder as contained in the pressurizing container under pressure, thereby obtaining the sputter target material,
    wherein the sputter target material has a micostructure seen at a perpendicular cross section to a sputtering surface, in which microstructure oxide particles exist around each island of the metal element (M), and wherein the maximum area of the island, which is defined by connecting the oxide particles with linear lines so as to form a closed zone, is not more than 1.0 mm$^2$.

2. A method according to claim 1, which comprises a further step of subjecting the sputter target material as sintered to plastic working.

3. A method according to claim 1, wherein in the amount of the at least one metal element (M) is 0.5 to 50 atomic %.

4. A method according to claim 1, wherein the sputter target material has a sputtering surface area of not less than 1 m$^2$.

5. A method according to claim 1, wherein the sputtering surface of the sputter target material has a rectangular shape, and each side length of the rectangular shape is not less than 1 m.

6. A method according to claim 1, wherein the at least one metal element (M) is Nb.

* * * * *